United States Patent

Back

Patent Number: 5,111,086
Date of Patent: May 5, 1992

[54] ADJUSTING DELAY CIRCUITRY

[75] Inventor: Paul R. Back, Groton, Mass.

[73] Assignee: Wang Laboratories, Inc., Lowell, Mass.

[21] Appl. No.: 615,729

[22] Filed: Nov. 19, 1990

[51] Int. Cl.$^5$ ............ H03K 5/13; H03K 5/159; H03K 3/01

[52] U.S. Cl. .................... 307/603; 307/606; 307/597; 328/55; 328/66

[58] Field of Search ............ 307/590, 595, 597, 600, 307/601, 602, 603, 606; 328/55, 66

[56] References Cited

U.S. PATENT DOCUMENTS 4,494,021 1/1985 Bell et al. ............... 307/601
4,859,954 8/1989 Yoshimura .............. 307/602

FOREIGN PATENT DOCUMENTS 373831 6/1990 European Pat. Off. .

OTHER PUBLICATIONS

Patent Abstract of Japan, vol. 7, No. 4 (E-151) (1149) Jan. 8, 1983 & JP-A-57 162 835 (Fijitsu, K.K.) Oct. 6, 1982.
Patent Abstract of Japan, vol. 9, No. 178 (E-330) (1902) Jul. 23, 1985 & JP-A-60 47 517 (Hitachi Seisakusho KK) Mar. 14, 1985.
NTIS Tech Notes, Jan. 1989, Springfield, VA, U.S., p. 19; Ansell E.: "System measures logic-Gate delays', " See whole document.
Patent Abstracts of Japan, vol. 10, No. 283 (E-440) (2339) Sep. 26, 1986 & JP-A-61 101 117 (Hitachi Micro Comput Eng Ltd.) May 20, 1986, see whole document.

Primary Examiner—Stanley D. Miller
Assistant Examiner—Trong Phan
Attorney, Agent, or Firm—Michael H. Shanahan

[57] ABSTRACT

Gate speed evaluation circuitry evaluates the operating speed of gates of a calibration network and adjusts the length of a tapped delay network on the same chip to provide uniform delay in a signal.

3 Claims, 3 Drawing Sheets

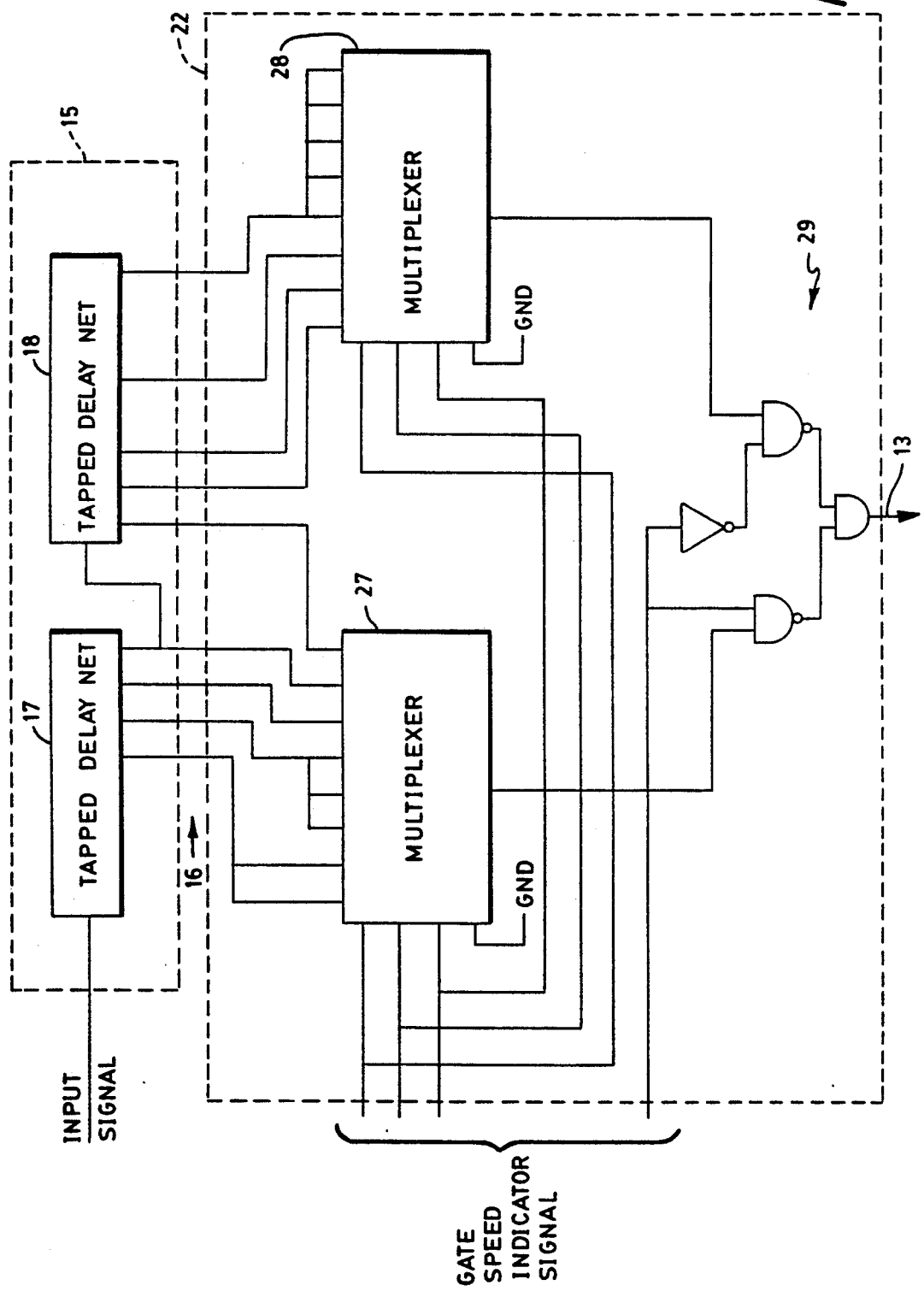

ADJUSTING DELAY CIRCUITRY

BRIEF SUMMARY OF THE INVENTION

This invention relates to electrical circuitry for introducing a specified delay between an input signal and an output signal. Such circuitry is employed in computers.

When using signal delay elements in a computer design, a designer must accommodate both the minimum and the maximum delay generated by the specified delay circuitry. Often, this accommodation requires lengthening the operating cycle of the computer with attendant degradation of performance. The degradation of performance is directly related to the range of variation in the delay of the delay circuitry, so that it is highly desirable to minimize the variation.

It has been found that the delay between input and output signals introduced by a realization of a given delay circuitry design depends to some degree on the gate speed of the devices used in the circuitry. This in turn depends on the processing conditions during manufacturing of the chip carrying the delay circuitry, as well as the temperature and power supply conditions that exist while running the circuitry.

Delay circuitry according to the invention provides a delayed signal by propagating an input signal through a network of successive gates. Intermediate taps are placed sequentially in the delay network so that different taps provide output signals which have passed through and been delayed by different numbers of network gates.

Gate speed evaluation circuitry is also provided which, in response to a calibrate command, evaluates the operating speed of gates and emits a continuing signal indicative of this gate speed. The evaluation is accomplished by circuitry which introduces the calibrate command signal into a network of successive calibration gates and during the interval between the application of this signal to the front end of the network and its emergence from the back end counts pulses of a system clock. The count during this interval is an indication of the speed of the calibration gates, the count being inversely proportional to the gate speed.

The gates of the tapped delay network and the gates of the calibration network are manufactured on the same chip, and therefore have much the same manufacturing idiosyncrasies, temperature, and power supply, etc. The evaluation circuitry accordingly provides an effective evaluation of the gate speed of the gates in the tapped network.

The count made by the evaluation circuit is retained until the next calibration command, and in the meantime is applied to selection circuitry to control selection of one of the taps of the tapped delay network and connect the selected tap to supply the desired delayed output. The position of the taps of the delay network and the organization of the selection circuitry are such that the number of gates through which an input signal passes to the selected tap is proportional to the reciprocal of the count and proportional to the gate speed.

Circuitry according to the invention accordingly introduces a delay between its input and output signals which is largely independent of the idiosyncratic variation of gate speeds in individual realizations of the design, and provides tolerances for delays generated by circuitry according to the invention that are much smaller than the tolerances for the gates which are used.

BRIEF DESCRIPTION OF THE DRAWING

FIG. 4 shows in more detail the delay network and tap selection circuitry of FIG. 2.

DETAILED DESCRIPTION

Figure 1:
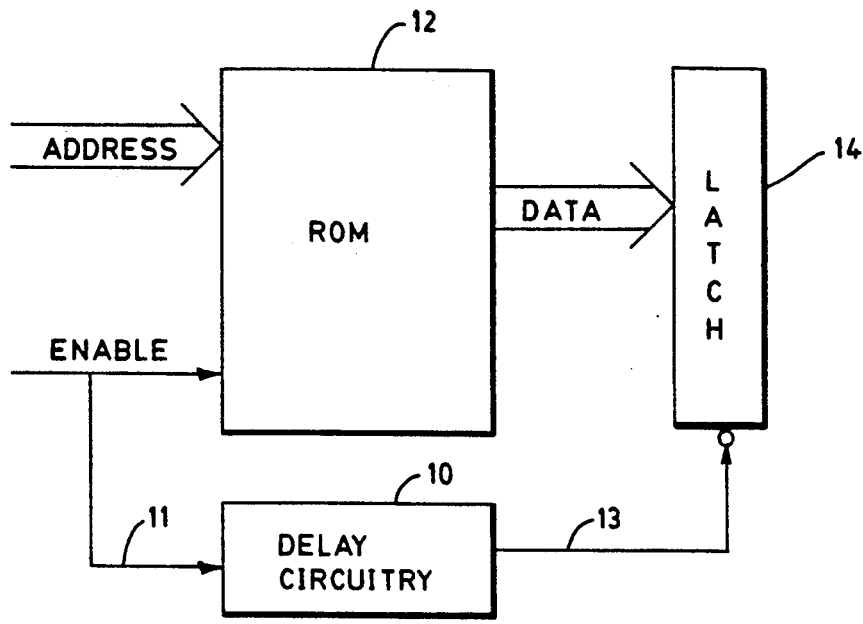
FIG. 1 shows delay circuitry according to the invention as it is used in a computer to generate a delay between an ENABLE signal applied to a ROM and a latching signal applied to a data latch receiving data from the ROM.

As shown in FIG. 1, delay circuitry 10, according to the invention is connected to receive as an input signal at input port 11 the ENABLE signal applied to ROM 12, and to present a delayed output signal at delayed signal output port 13, which is applied to latch 14. The delay introduced by delay circuitry 10 between its input signal and its output signal is designed to provide sufficient time for the DATA signal from ROM 12 to become stable before being accepted into latch 14.

Figure 2:
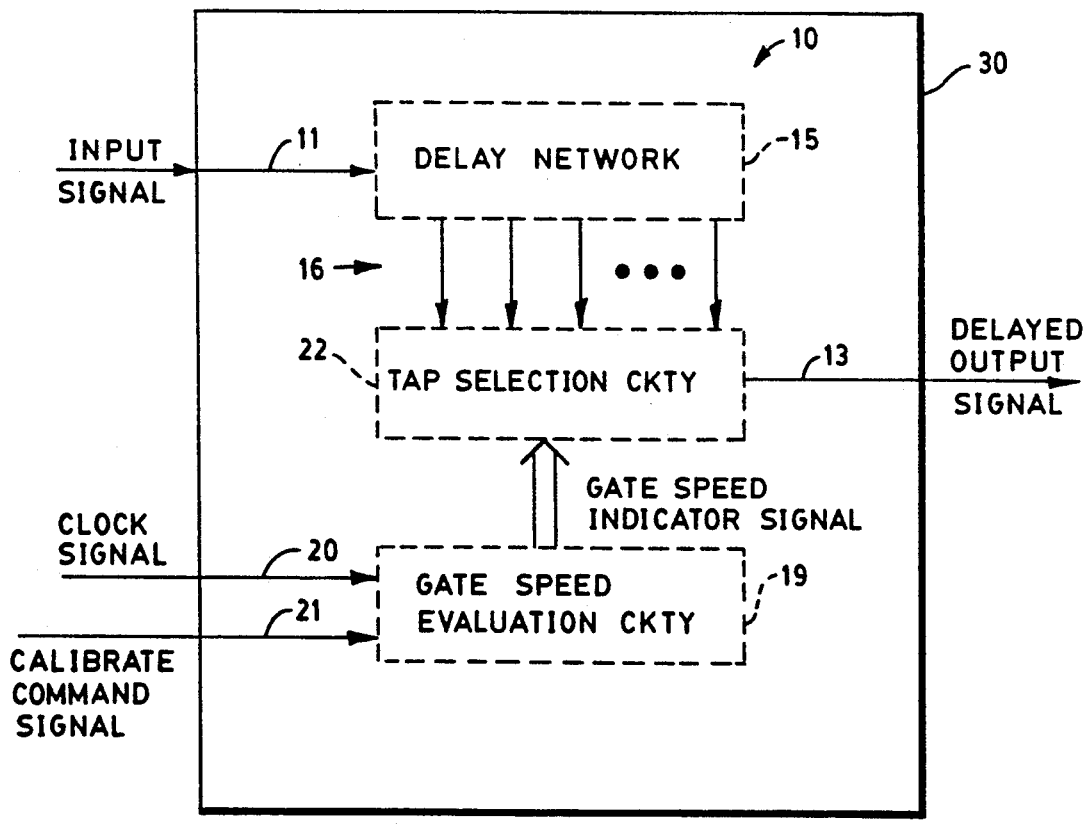
FIG. 2 shows schematically the components of the delay circuitry of FIG. 1.

Turning to FIG. 2, delay circuitry 10 includes delay network 15, gate speed evaluation circuitry 19, and tap selection circuitry 22, all on chip 30. Delay network 15 is internally constructed to propagate a signal applied to input port 11 through a succession or chain of gates. Delay network 15 has a plurality of taps 16 each connected internally to a distinct intermediate point in the gate chain so that each of the several taps 16 is connected internally through a distinct number of gates to input port 11. As shown in FIG. 4, delay network 15 is composed of two linked tapped delay modules 17, 18. These modules have conventional structure well known to those skilled in the art of computer hardware, and can be specified and obtained from manufacturers without reference to details of internal structure.

Delay circuitry 10 also includes (as shown in FIG. 2) gate speed evaluation circuitry 19, which is connected to receive on port 20 a CLOCK SIGNAL and on port 21 CALIBRATE COMMAND SIGNALS both generated elsewhere in the system and to output GATE SPEED INDICATOR SIGNALS.

Tap selection circuitry 22 is connected to taps 16, to receive GATE SPEED EVALUATION SIGNALS from gate speed evaluation circuitry 19, and to emit DELAYED OUTPUT SIGNALS on delayed signal output port 13.

Figure 3:
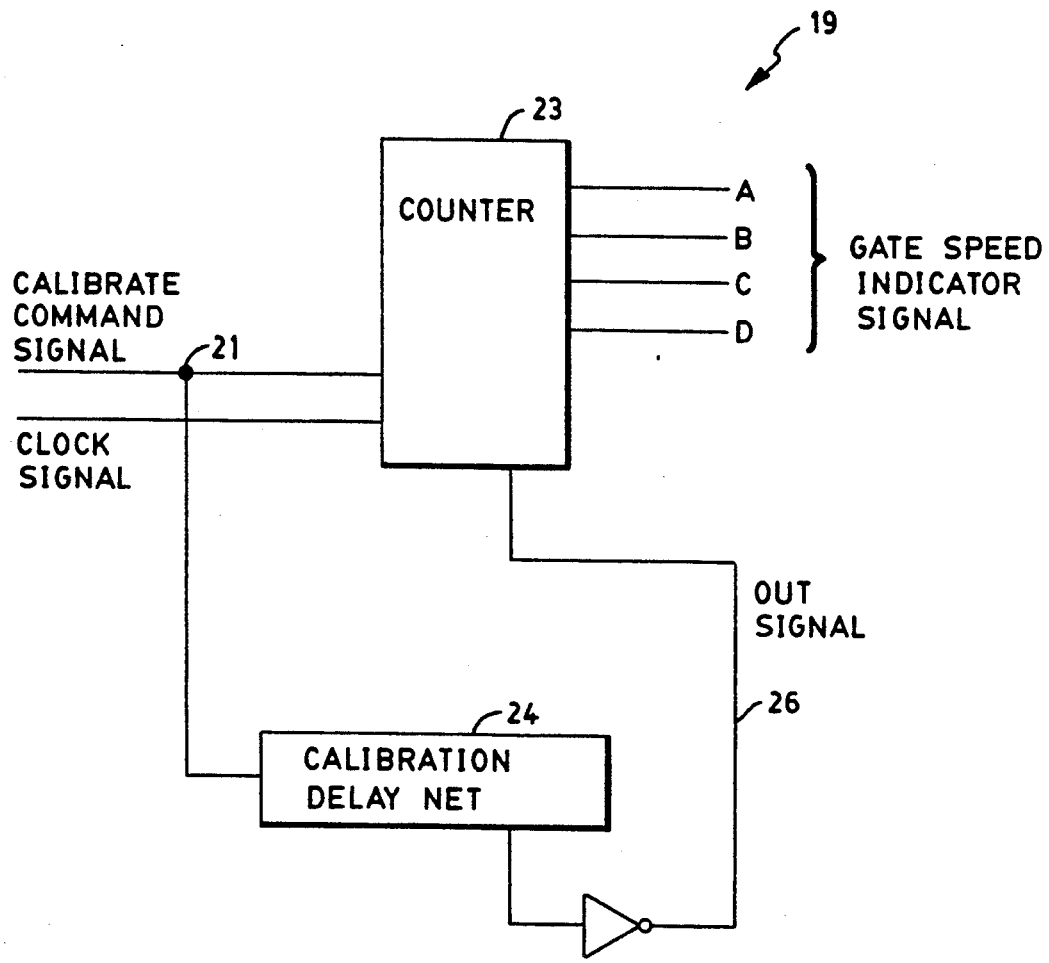
FIG. 3 shows in more detail the gate speed evaluation circuitry of FIG. 2.

As shown more particularly in FIG. 3, gate speed evaluation circuitry 19 includes counter 23 and calibration delay network 24. Calibration delay network 24 is connected to receive CALIBRATE COMMAND SIGNALS from port 21 and to emit OUT SIGNALS from port 26. Calibration delay network 24 is a delay network module such as networks 17 and 18. Counter 23 is connected to receive CALIBRATE COMMAND SIGNALS from port 21, CLOCK SIGNALS from port 20, and OUT SIGNALS from calibration delay network 24. Counter 23 emits GATE SPEED INDICATOR SIGNALS on lines A, B, C, and D.

As shown more particularly in FIG. 4, tap selection circuitry 22 includes multiplexers 27 and 28 and several gates 29, interconnected as shown in FIG. 4. The multiplexers are standard modules conventionally connected to select and connect one of taps 16 to output port 13. They are readily available and need no further explanation for those skilled in the computer hardware design art.

The operation of the circuitry is as follows. A CALIBRATE COMMAND SIGNAL is generated and sent to gate speed evaluation circuitry 19. This command signal may be generated in the course of the start up sequence of the system of which delay circuitry 10 is a part, or it may be programmed and generated by the system processor. In any case the CALIBRATE COMMAND SIGNAL resets and then at a transition starts counter 23 counting pulses of the CLOCK SIGNAL The transition of the CALIBRATE COMMAND SIGNAL also applies a signal which begins to propagate through calibration delay network 24. After propagating through calibration delay network 24, this signal is emited as OUT SIGNAL and applied to counter 23. This stops the counter and the counter presents its count as a GATE SPEED INDICATOR SIGNAL. The multiplexers of tap selection circuitry 22 are controled by the GATE SPEED INDICATOR SIGNAL to connect a selected one of taps 16 to the delayed signal output port 13. The condition of the evaluation circuitry and the selection circuitry remains unchanged until another CALIBRATE COMMAND SIGNAL is generated.

At this point any INPUT SIGNALS applied to input port 11 will propagate through delay network 15 to the selected tap and will be shunted to the delayed signal output port 13 to provide a DELAYED OUTPUT SIGNAL.

The circuitry described thus adapts the effective chain of gates in the delay network in response to its measurement of gate speed, thereby compensating for variation in gate speed in different realizations of the circuitry. It will be recognized by those skilled in the art that the invention can be used in any circumstances where it is desired to provide a signal delay which is realized with low variation from one implementation to another

I claim:

1. Delay circuitry for introducing a delay between INPUT SIGNALS and DELAYED OUTPUT SIGNALS derived from said INPUT SIGNAL, said delay circuitry having an input port to receive said INPUT SIGNALS and a delayed signal output port to emit said DELAYED OUTPUT SIGNALS, said delay circuitry including a delay network having a plurality of gates connected to receive said INPUT SIGNALS and to pass a signal derived from a received INPUT SIGNAL through successive gates of said delay network, said delay network having taps connected sequentially so that different taps emit signals that have passed through a different number of gates.

gate speed evaluation circuitry including gates and having means to receive CALIBRATE COMMAND SIGNALS, said gate speed evaluating circuitry including means for generating in response to a received CALIBRATE COMMAND SIGNAL a GATE SPEED INDICATOR SIGNAL indicative of the operating speed of gates in the gate speed evaluating circuitry, tap selection circuitry connected to receive GATE SPEED INDICATOR SIGNALS from said gate speed evaluating circuitry and including means for selecting and connecting to the delayed signal output port one of said taps, such selecting being controlled by a received GATE SPEED INDICATOR SIGNAL, the tap selected being such that there is a direct relationship between the operating speed of gates in the gate speed evaluation circuitry and the number of gates between the input port and the selected tap, said delay network and said delay evaluation circuitry being on one chip.

2. Delay circuitry as claimed in claim , wherein said gate speed evaluation circuitry includes a calibration delay network in which a signal propagates through a chain of gates and is emitted at the end of the chain as an OUT SIGNAL, and a counter supplied with CLOCK SIGNALS, the counter being connected to receive and start counting CLOCK SIGNALS upon receiving a CALIBRATE COMMAND SIGNAL and, on receiving an OUT SIGNAL from said calibration delay network, to stop counting and emit a count of CLOCK SIGNALS as said GATE SPEED INDICATOR SIGNAL.

3. Delay circuitry as claimed in claim 2, wherein the tap selected by the tap selection circuitry is such that the number of gates between the input port and the selected tap is proportional to the reciprocal of the count of CLOCK SIGNALS emitted as a GATE SPEED INDICATOR SIGNAL.

* * * * *

UNITED STATES PATENT AND TRADEMARK OFFICE
CERTIFICATE OF CORRECTION

PATENT NO. : 5111086
DATED : May 5, 1992
INVENTOR(S) : Paul R Back

It is certified that error appears in the above—identified patent and that said Letters Patent is hereby corrected as shown below:

Column 4, claim 2, line 30 should read:

-- Delay circuitry as claimed in claim 1, wherein said --.

Signed and Sealed this

Seventh Day of September, 1993

Attest:

BRUCE LEHMAN

Attesting Officer      Commissioner of Patents and Trademarks